United States Patent [19]
Rhodes

[11] Patent Number: 5,025,224
[45] Date of Patent: Jun. 18, 1991

[54] INCREMENTAL INTEGRATOR CIRCUIT

[75] Inventor: Melvin H. Rhodes, Cedar Rapids, Iowa

[73] Assignee: The United States of America as represented by the Secretary of the Air Force, Washington, D.C.

[21] Appl. No.: 447,749

[22] Filed: Dec. 8, 1989

[51] Int. Cl.⁵ .................. G06G 7/12; G06G 7/14; G06G 7/18
[52] U.S. Cl. .................. 328/127; 328/142; 328/146; 364/829; 307/490; 307/352
[58] Field of Search .............. 328/127, 151, 142, 146, 328/147; 307/490, 494, 352; 364/829

[56] References Cited
U.S. PATENT DOCUMENTS

| | | | |
|---|---|---|---|
| 3,131,296 | 4/1964 | Bohn | 364/829 |
| 3,555,298 | 1/1971 | Neelands | 328/146 |
| 3,649,826 | 3/1972 | Larsson et al. | 328/142 |
| 3,717,818 | 2/1973 | Herbst | 328/146 |
| 3,767,899 | 10/1973 | Barter | 235/61.6 A |
| 3,906,214 | 9/1975 | Hess | 235/183 |
| 3,961,271 | 6/1976 | Zlydak et al. | 328/147 |
| 4,020,363 | 4/1977 | Numata et al. | 307/229 |
| 4,030,038 | 6/1977 | Daniel et al. | 328/127 |
| 4,278,943 | 7/1981 | Masuda et al. | 328/127 |
| 4,349,769 | 9/1982 | Willoteaux | 328/127 |
| 4,574,206 | 3/1986 | Todokoro et al. | 328/147 |

Primary Examiner—Stanley D. Miller
Assistant Examiner—Yen Nguyen
Attorney, Agent, or Firm—William G. Auton; Donald J. Singer

[57] ABSTRACT

An incremental integrator integrates a signal from a previous time to the present time to obtain an average value for the signal. An input signal is applied to an analog integration circuit which performs a continuous integration of the input signal. A time delay circuit delays the output of the integration circuit for a time period equal to that of a sampling clock. The output of the delay circuit as well as the output of the integration circuit are applied to a differential amplifier. A sampling circuit samples the output of the differential amplifier so as to give a value equal to the integral for a period equal to the delay circuit period at the time the signal was sampled.

2 Claims, 2 Drawing Sheets

INCREMENTAL INTEGRATOR CIRCUIT

BACKGROUND OF THE INVENTION

The present invention relates generally to electronic integrator circuits, and more specifically to an incremental integrate and dump circuit.

Electronic integrator circuits are devices which produce an electronic output signal which is proportional to the integral of the input signals that they receive. Such devices have digital applications in analog-to-digital converters. In such applications, the integrator circuit approximates the mathematical process of integration.

It is often desired to integrate a signal from a previous time, (t-T), to the present time, t, in order to get an average value for the time period, (t-T). This previously has been done by using an integrate and dump circuit. An integrate and dump circuit generally consists of the charging of a capacitor through a resistor end of the period then discharging or dumping the charge on the capacitor to start the next period.

The prior art integrators, as described above, are simple, but require dump circuits to discharge the capacitor after each cycle of use. High speed electronic applications can require the use of integrators over very short periods ranging from 10 to 1,000 nanoseconds. In such applications, it is very difficult to dump the charge on the capacitor of the integrator The task of providing a high speed incremental integrator is alleviated, to some extent, by the systems disclosed in the following U.S. Patents, the disclosures of which are incorporated herein by reference:

U.S. Pat. No. 4,030,038 issued to Daniel et al.;
U.S. Pat. No. 3,767,899 issued to L. Barter;
U.S. Pat. No. 3,906,214 issued to R. Hess;
U.S. Pat. No. 4,020,363 issued to S. Numata et al; and
U.S. Pat. No. 4,278,943 issued to E. Basuda et al.

All of the above-cited disclose integration circuits. Of particular note is the system of U.S. Pat. No. 4,030,038 which discloses an integrator circuit having several periodic dumping integrators all sharing the same analog-to-digital converter. U.S. Pat. No. 3,767,899 discloses a digital integrator for evaluating operator selected portions of analog chart traces. U.S. Pat. No. 3,906,214 discloses a signal retaining integrator having the capability of maintaining a reference voltage required for precision integration.

While the systems disclosed in the above-cited references are instructive, the need remains to provide an incremental integrator circuit which outputs a time-averaged value of an analog signal over short intervals without requiring a dump circuit to discharge the integrator. The present invention is intended to satisfy that need.

SUMMARY OF THE INVENTION

The present invention is an incremental integrator circuit which integrates a signal from a previous time to the present time to obtain an average value for the signal using: an analog integrator circuit, a time delay circuit, a differential amplifier, a clock, and a sampling circuit. The analog integrator circuit continuously integrates an input signal from an analog signal source, to output an integrated analog signal.

The time delay circuit receives and delays the integrated analog signal from the analog integrator circuit, and outputs a delayed integrated analog signal. The delay period is equal to that of the sampling clock.

The outputs of the time delay circuit and the analog integrator circuit are both received by the differential amplifier, which amplifies the difference between the two signals. The output of the analog integrator circuit is received by the non-inverting input terminal of the differential amplifier, and the output of the time delay circuit is received by the differential amplifier's inverting input terminal. The differential amplifier outputs a difference signal which is proportional to the difference between the two signals it receives.

The sampling circuit receives a clock signal from the clock circuit, and samples the output of the differential amplifier so as to give a value equal to the integral for a period equal to the delay circuit period at the time the signal was sampled. The incremental integrator thereby effectively integrates received signals over an interval to produce a signal proportional to the average value received over that interval.

Another embodiment of the invention uses a flip flop in place of the sampling circuit. The flip flop is triggered by the differential amplifier and the clock circuit so that it will output the sign of the integrated value for a clock period.

The analog integration circuit of the first embodiment does a continuous integration of received input signals over intervals of time. When only the sign of the integrated value is desired, then the second embodiment may be used.

As described above, it is an object of the present invention to provide an incremental integrator which integrates an input signal over a certain interval to obtain an average value of the input over the interval.

It is another object of the present invention to provide continuous integration of the input signals over successive intervals.

It is another object of the present invention to output the sign of the integral of an input signal, which is monitored over successive intervals of time.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is an incremental integrator circuit, which integrates an input analog signal over successive intervals of time to produce an average value of the input over each interval.

As mentioned above, it is often desired to integrate a signal from a previous time, (t-T), to the present time, t, in order to get an average value for the time period, (t-T). This previously has been done by using an integrate and dump circuit. An integrate and dump circuit generally consists of the charging of a capacitor through a resistor for a predetermined time period, sampling the charge value at the end of the period then discharging or dumping the charge on the capacitor to start the next period.

The reader's attention is now directed towards FIGS. 1 and 2, which are electrical schematics of prior art integrator circuits Both systems produce an output which is proportional to the integral of the input E in over the interval of T, as given below in Equation 1:

$$E_{OUT} = \frac{1}{T} \int_T E_{IN} dt \qquad (1)$$

for T=RC; where
R is in ohms and C is in farads.

Figure 1:
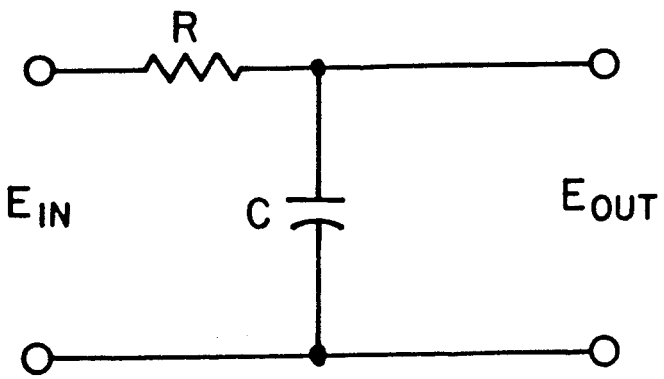
FIGS. 1 and 2 are electrical schematics of prior art integrator circuits.
Figure 2:
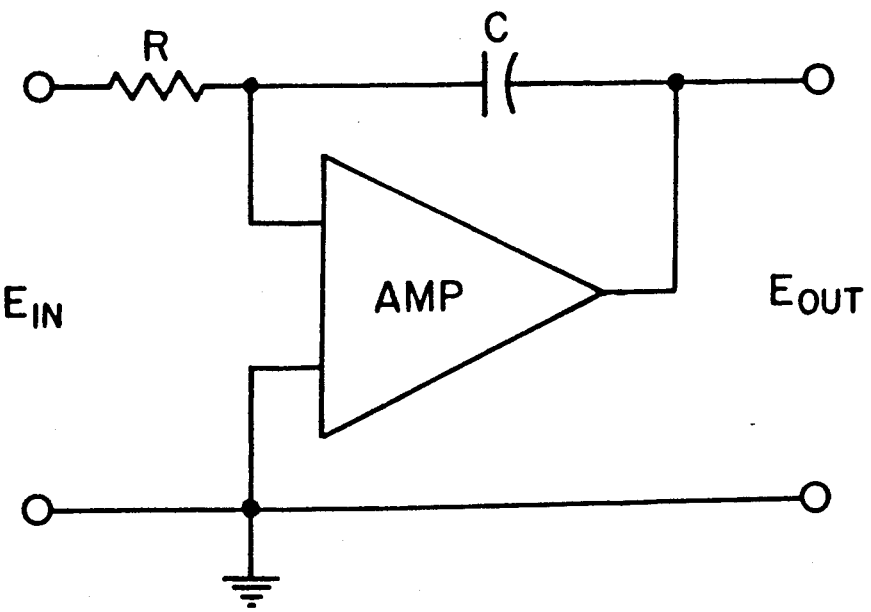

The system of FIG. 1 integrates without amplifying the input, while the system of FIG. 2 provides amplification. Both systems of FIGS. 1 and 2 would require a dump circuit to discharge the capacitor at the end of each interval, if successive use is planned. The purpose of the present invention is to provide a system which will accept the charge of the capacitor, and output an average value of the input over successive intervals of time for continuous use.

Figure 3:
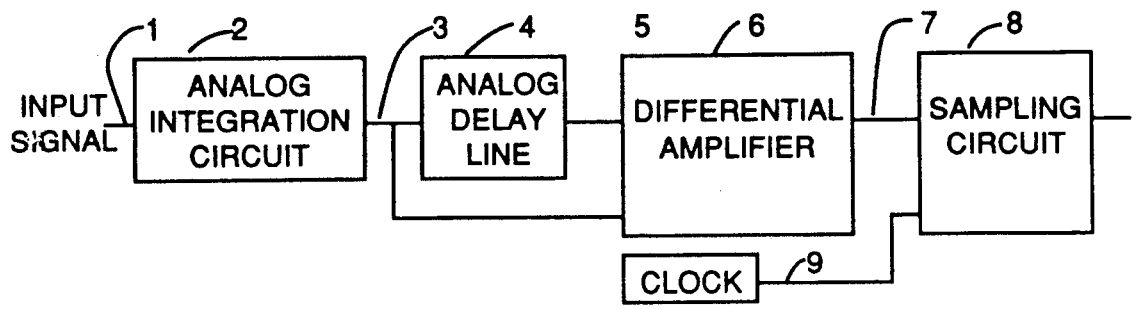
FIGS. 3. 4 and 5 are block diagrams of embodiments of the present invention.

The readers attention is now directed towards FIG. 3, which is a block diagram of the present invention. The incremental integrator circuit of FIG. 3 outputs an average value of the input signal (1) it receives using: an analog integration circuit 2, an analog delay line 4, a differential amplifier 6, a sampling circuit 8, and a clock 9.

The analog integration circuit 2 integrates the input signal 1 from a signal source over an interval T to produce an integrated analog signal. The analog integration circuit can be the integrators used in FIGS. 1 and 2 and has its interval determined by the product of RC, as described above. However, when the analog delay line 4 and differential amplifier 6 accept the output of the analog integration circuit, they effectively discharge its internal capacitor, and act as a dump circuit so that the incremental integrator can be used for successive intervals of time.

The analog delay line 4 receives and delays the integrated analog signal from the analog integrator, and outputs a delayed The clock circuit may be an oscillator which produces a clock signal pulse characterized by a duration equal to T, where T is the sampling interval of the sampling circuit 8, and the integration interval used by the integrator 2. The output of the sampling circuit 8 is an integrated signal which represents the average value of the input received by the analog integration circuit 2 over the interval T.

The incremental integrator circuit of FIG. 3 continuously integrates received signals over an interval to produce a signal proportional to the average value received over that interval. Its design is superior to the integrator of FIG. 1, because the analog integration circuit does a continuous integration of the input signal. The time delay period is the same as the sampling clock. The differential signal applied to the amplifier 6 is proportional to integral of the input signal 1 between the present time t and t-T, where T is the delay period. Sampling the output of the differential amplifier 7 will give a value equal to integral for a period equal to the delay circuit period at the time the signal was sampled.

For practical purposes the integrator can be a low pass filter with a time constantly much greater than the time delay period.

Figure 4:
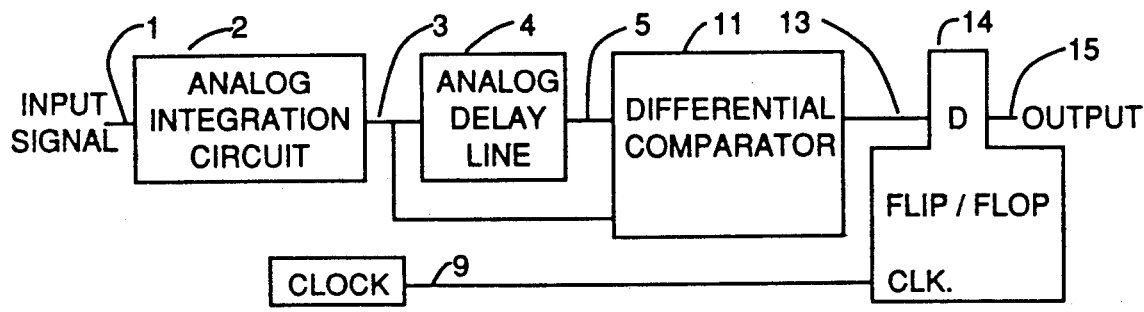

If only the sign of the integrated value for the period is desired then the amplifier can be replaced by a differential comparator and a "D" flip/flop can sample the output of the comparator as shown in FIG. 4. It is also practical to use a integrated analog signal. The delay period is the same period of the sampling interval T as used by the analog integration circuit 2 and the sampling clock 9. It is believed that such delay circuits are known in the art, and a variety of delay line systems exist that are suitable for use. One of the more common delay lines entails a series of inductor elements, which have one of a series of parallel capacitors connected between each inductor. Examples of such delay systems are illustrated in such standard texts as the "Modern Dictionary of Electronics" by Rudolf F. Graf, the disclosure of which is incorporated herein by reference.

As mentioned above, the output from the integration circuit 3 is applied to an analog delay circuit 4 and to the non-inverting input terminal of the differential amplifier produces an output by amplifying the difference between the two signals it receives over its input terminals. Such amplifiers are believed to be known in the art, and are illustrated schematically in the above-cited Graf reference. In operation, the differential amplifier 6 outputs a difference signal that is proportional to the two signals it receives.

The sampling circuit 8 receives a clock signal from the clock circuit 9, and samples the output of the differential amplifier so as to give a value equal to the integral for a period equal to the delay circuit period at the time the signal was sampled. It is believed that both sampling circuits and clock oscillators are well known in the art, and described in the above-cited Graf reference. differential comparator with a latch such as the Plessey part SP9685 to sample the sign value at "t".

The reader's attention is now directed towards FIG. 4, which is a block diagram of another embodiment of the present invention. As mentioned above, the system of FIG. 4 uses a flip flop 14 in place of the sampling circuit 8. The flip flop 14 is triggered by the differential amplifier and the clock circuit so that it will output the sign of the integrated value for a clock period interval. All of the other elements of FIG. 4 function as described above for like enumerated components in FIG. 3.

The analog integration circuit of FIG. 3 does a continuous integration of received input signals over intervals of time. When only the sign of the integrated value is desired, then the system of FIG. 4 may be used, as described below.

Flip Flop circuits are commercially available bistable multivibrator components, and are described in the above-cited Graf reference. These circuits have two stable states. In one state, the first stage is conducting, and the second stage is cut off. In the other state, the second stage is conducting, and the first stage is cut off. In the system of FIG. 4, the stage of the flip flop 14 is triggered by a trigger signal produced by the differential comparator 11 during the interval it receives a clock pulse from the clock 9. This difference signal will act as a trigger signal to cause the flip flop 14 to switch states if the sign of the integrated value changes. The trigger signal of the differential comparator 11 is a little different than the difference signal of the differential amplifier 6 of FIG. 3, as discussed below. When it is stated that the system of FIG. 4 indicates "the sign of the integrated value" this means that the system of FIG. 4 outputs a signal that indicates whether the difference between the current integrated analog signal and the delayed integrated signal is positive or negative. This indicates whether or not the value of the integral is increasing as time progresses.

Differential comparators compare two input voltages with each other, and often contain a differential amplifier. When a first input voltage is lower than the second input voltage, the differential comparator is in one state. When the first input voltage is higher than the second input voltage, the differential comparator is in the opposite state. In FIG. 4, the differential comparator compares a delayed integrated signal from the delay line 4, with the integrated signal from the integration circuit 2, and thereby produces an output signal. The output signal of the differential comparator is the trigger signal that indicates to the flip flop 14 whether the delayed integrated signal is greater than the integrated signal. This triggers the flip flop 14 to switch states as described above.

It is believed that differential comparator circuits and bistable multivibrator Eccles-Jordan flip flops are well known, and are described in standard texts as the above-cited Graf reference. A variety of different elements can serve as the differential comparator 11 of FIG. 4. For example, the differential amplifier 6 of FIG. 3, in series with a forward biased diode will only produce a signal when the integrated sign is greater than the delayed integrated signal.

As described above, the system of FIG. 4 is an incremental integrator which outputs a signal which indicates whether the value of the integral is increasing as time progresses, and if the value of the integral is decreasing as time progresses. This determination is actually made at the differential comparator 11 of FIG. 4, because when the current value of the integral is greater than the delayed integrated signal, the value of the integral is increasing as time progresses.

The design in FIG. 4 uses a flip flop circuit 14 to provide the output signal 15. As discussed above, the output of the flip flop indicates what state it is in. For example, when the flip flop is in a first state, this may indicate that the output of the comparator indicates that delayed integrated signal is less than the current integrated input signal from the integrator. However, when the comparator's output indicates that the delayed integrated signal becomes greater than the current value of the integral the output of the comparator may trigger the flip flop to switch to its second state. Since the flip flop's output indicates the state it is in, it provides a continuous indication of the sign of the difference between the current integral and the delayed integral value as time progresses.

Figure 5:
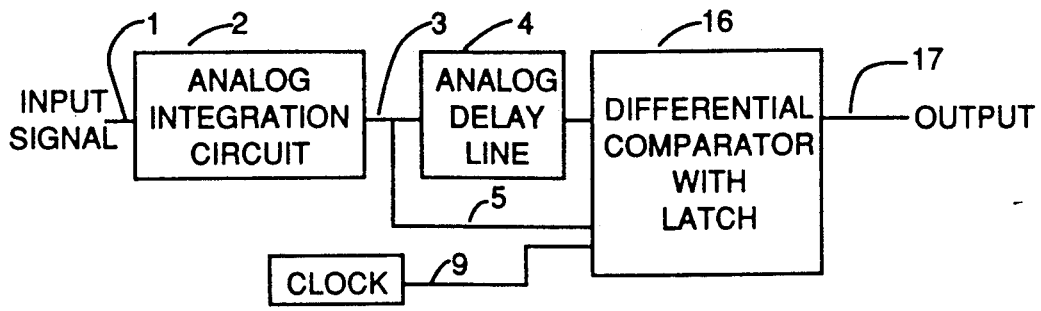

The system of FIG. 5 eliminates the flip flop 14 and uses a differential comparator which has a latch 16 to provide the output signal 17. As mentioned above, the current integrated input signal is compared against an earlier delayed integrated input by the differential comparator. In FIG. 5, the output is produced by a latch circuit, which is in series with the differential comparator, and which performs the same function as the flip flop of FIG. 4.

The invention, as depicted in FIGS. 3 and 4, is believed to be an improvement over the prior art integrators of FIGS. 1 and 2. The present invention is capable of integrating an input analog signal over successive intervals of time, and does not require an additional dump circuit to discharge the capacitor. The invention is intended for use over very short periods, of the order of 10 to 1,000 nanosecond periods, where it would be very difficult to dump the charge on the integrator. In the present invention, the analog delay line and the differential amplifier continuously accept the output signals of the integrator circuit to allow continuous and sequential integration of the input signal.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. An incremental integrator which receives and integrates an input signal from a signal source to obtain an average value of said input signal over a sequence of time intervals, said incremental integrator comprising:

an analog integration circuit which produces an output signal by receiving and integrating said input signal from said signal source over said sequence of time intervals, said analog integration circuit thereby producing an integrated input signal for each time interval;

a means for delaying signals for a period of time which equals one of said time intervals, said delaying means being connected with and receiving said integrated input signal from said analog integration circuit, said delaying means thereby producing a delayed integrated signal;

a differential amplifier which receives and subtracts said delayed integrated signal from said delaying means, from the integrated input signal from said analog integration circuit during each time interval, said differential amplifier outputting a difference signal which is proportional to a value which equals a difference in amplitude between the delayed integrated signal and the integrated input signal of a current time interval;

a clock circuit which produces a clock signal which has pulses which have durations which equal said time intervals of said analog integration circuit and said delaying means; and a means for sampling signals, said sampling means receiving and sampling said difference signal from said differential amplifier and said clock signal from said clock circuit to output a sampled signal proportionate to the average value of said input signal over each of said sequence of time intervals.

2. An incremental integrator which receives and integrates an input signal from a signal source over a sequence of time intervals to produce an integral which has a value, said incremental integrator outputting a signal which indicates whether the value of the integral is increasing and decreasing as said sequence of time intervals progresses, said incremental integrator comprising:

an analog integration circuit which produces an output signal by receiving and integrating said input signal from said signal source over said sequence of time intervals, said analog integration circuit thereby producing an integrated input signal for each time interval;

a means for delaying signals for a period of time which equals one of said time intervals, said delaying means being connected with and receiving said integrated input signal from said analog integration circuit, said delaying means thereby producing a delayed integrated signal;

a differential comparator which receives and compares said delayed integrated signal from said delaying means with the integrated input signal from said analog integration circuit during each time interval, said differential comparator circuit thereby outputting an output signal which indicates when the delayed integrator signal is greater than the integrated input signal said output signal also indicating when said integrated input signal is greater then said delayed integrated signal;

a clock circuit which produces a clock signal which has pulses which have durations which equal said time intervals of said analog integration circuit and said delaying means; and a flip flop circuit which receives said clock signal from said clock circuit and said output signal of said differential comparator, said flip flop circuit having a first and a second state, said flip flop circuit being in said first state when said output signal of said differential comparator indicates that said integrated input signal is greater than said delayed integrated signal, and said flip flop switching to said second state when said output signal of said differential comparator indicates that said delayed integrated signal is greater than said integrated input signal, said flip flop circuit providing an output signal which indicates what state it is in, said output signal thereby indicating whether the value of the integral of the input signal is increasing as time progresses, and whether the value of the integral is decreasing as time progresses because when a current value of the integral is greater than the delayed integral signal, the value of the integral is increasing as time progresses.

* * * * *